(12) United States Patent
Zhang

(10) Patent No.: US 11,503,729 B2
(45) Date of Patent: Nov. 15, 2022

(54) MOBILE TERMINAL AND HINGE MECHANISM

(71) Applicant: VIVO MOBILE COMMUNICATION CO., LTD., Guangdong (CN)

(72) Inventor: Xinfu Zhang, Dongguan (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 33 days.

(21) Appl. No.: 17/200,010

(22) Filed: Mar. 12, 2021

(65) Prior Publication Data

US 2021/0204429 A1 Jul. 1, 2021

Related U.S. Application Data

(63) Continuation of application No. PCT/CN2019/105596, filed on Sep. 12, 2019.

(30) Foreign Application Priority Data

Sep. 13, 2018 (CN) .......................... 201811071214.2

(51) Int. Cl.
*H05K 5/02* (2006.01)
*G06F 1/16* (2006.01)

(52) U.S. Cl.
CPC ......... *H05K 5/0226* (2013.01); *G06F 1/1652* (2013.01)

(58) Field of Classification Search
CPC combination set(s) only.
See application file for complete search history.

(56) References Cited

U.S. PATENT DOCUMENTS 9,625,947 B2 * 4/2017 Lee ....................... G06F 1/1616
10,459,482 B2 * 10/2019 McDermid ............. G09F 9/301
(Continued)

FOREIGN PATENT DOCUMENTS

CN      203003889 U    6/2013
CN      103620516 A    3/2014
(Continued)

OTHER PUBLICATIONS

Supplementary European Search Report regarding Patent Application No. 19858797.4-1224/3851687; PCT/CN2019/105596, dated Apr. 28, 2022.

(Continued)

*Primary Examiner* — Lisa Lea-Edmonds
(74) *Attorney, Agent, or Firm* — Harness, Dickey & Pierce, P.L.C.

(57) ABSTRACT

A hinge mechanism includes at least two shafts arranged in a row, a linkage mechanism and two connecting parts. The two connecting parts are fixedly connected to two shafts on the outermost sides, respectively. Two adjacent shafts are connected by the linkage mechanism. The linkage mechanism includes a first linkage and a second linkage. One of the two adjacent shafts is hinged to a first end of the first linkage, the other one is hinged to a first end of the second linkage, and a second end of the first linkage is hinged to a second end of the second linkage. When hinge points where the first linkage and the second linkage are respectively hinged to the two adjacent shafts and a hinge point between the first linkage and the second linkage are in a same straight line, there is a gap between the two adjacent shafts.

17 Claims, 3 Drawing Sheets

(56) References Cited

U.S. PATENT DOCUMENTS

| | | | |
|---|---|---|---|
| 10,778,822 B2 * | 9/2020 | Si | G06F 1/1652 |
| 10,886,498 B2 * | 1/2021 | Large | H01L 51/0097 |
| 11,061,436 B2 * | 7/2021 | O'Neil | G06F 1/1681 |
| 11,068,032 B2 * | 7/2021 | Huang | G06F 1/1616 |
| 11,231,752 B2 * | 1/2022 | Liu | G06F 1/1681 |
| 2012/0307423 A1 | 12/2012 | Bohn et al. | |
| 2013/0219663 A1 | 8/2013 | Cai | |
| 2015/0131222 A1 | 5/2015 | Kauhaniemi et al. | |
| 2017/0208157 A1 | 7/2017 | Kim et al. | |
| 2017/0208699 A1 * | 7/2017 | McDermid | G09F 9/301 |
| 2017/0303414 A1 * | 10/2017 | Chu | H05K 5/0226 |
| 2018/0092223 A1 | 3/2018 | Hsu | |
| 2018/0373297 A1 | 12/2018 | Liao et al. | |
| 2019/0179373 A1 | 6/2019 | Cheng et al. | |
| 2020/0326757 A1 * | 10/2020 | Huang | G06F 1/1681 |
| 2021/0216103 A1 * | 7/2021 | Chen | G06F 1/1681 |
| 2021/0216108 A1 * | 7/2021 | Lee | G06F 1/1626 |
| 2021/0311531 A1 * | 10/2021 | Huang | G06F 1/1652 |
| 2022/0051594 A1 * | 2/2022 | Eguchi | G06F 1/1647 |

FOREIGN PATENT DOCUMENTS

| | | |
|---|---|---|
| CN | 104637408 A | 5/2015 |
| CN | 205847346 U | 12/2016 |
| CN | 107846484 A | 3/2018 |
| CN | 207442781 U | 6/2018 |
| CN | 109210071 A | 1/2019 |
| GB | 2521152 A | 6/2015 |
| KR | 20180081250 A | 7/2018 |
| TW | M537781 U | 3/2017 |
| WO | WO-2016209247 A1 | 12/2016 |

OTHER PUBLICATIONS

International Search Report and Written Opinion of the International Searching Authority regarding International Patent Application No. PCT/CN2019/105596, dated Dec. 11, 2019. Translation provided by Bohui Intellectual Property.

First Office Action regarding Chinese Patent Application No. 201811071214.2, dated Nov. 21, 2019. Translation provided by Bohui Intellectual Property.

Second Office Action regarding Chinese Patent Application No. 201811071214.2, dated Jun. 9, 2020. Translation provided by Bohui Intellectual Property.

Notification to Grant Patent Right for Invention regarding Chinese Patent Application No. 201811071214.2, dated Sep. 2, 2020. Translation provided by Bohui Intellectual Property.

* cited by examiner

MOBILE TERMINAL AND HINGE MECHANISM

CROSS-REFERENCE TO RELATED APPLICATIONS

This application is a continuation of PCT Application No. PCT/CN2019/105596, filed on Sep. 12, 2019, which claims priority to Chinese Patent Application No. 201811071214.2 filed on Sep. 13, 2018, both of which are incorporated herein by reference in their entireties.

TECHNICAL FIELD

The present disclosure relates to the field of mobile terminal technologies, and in particular, to a mobile terminal and a hinge mechanism.

BACKGROUND

At present, large screen mobile terminal is getting more and more popular. How to increase the screen area of mobile terminal on the premise that the overall dimension of mobile terminal is preset is an important research and development direction for current designers.

SUMMARY

A hinge mechanism comprises at least two shafts arranged in a row, a linkage mechanism and two connecting parts which are fixedly connected to the two shafts on the outermost side respectively. Two adjacent shafts are connected by means of the linkage mechanism. The linkage mechanism comprises a first linkage and a second linkage. One of the two adjacent shafts is hinged to a first end of the first linkage, and the other shaft is hinged to a first end of the second linkage, and a second end of the first linkage is hinged to a second end of the second linkage. When the hinge point where the first linkage and the second linkage are respectively hinged to two adjacent shafts and the hinge point of the first linkage and the second linkage are in the same straight line, a gap is formed between the two adjacent shafts.

A mobile terminal comprises a flexible screen, a first shell, a second shell and a hinge mechanism described above. The first shell is fixedly connected to a connecting part and the second shell is fixedly connected to the other connecting part. The flexible screen is installed in the mounting area formed by the first shell, the second shell and the hinge mechanism.

The technical solution adopted in the present disclosure can achieve the following beneficial effects:

BRIEF DESCRIPTION OF DRAWINGS

The accompanying drawings illustrated herein are provided to further understand the present disclosure and form a part of the present disclosure. The exemplary embodiments of the present disclosure and the descriptions thereof are used to explain the present disclosure and do not constitute an improper limitation on the present disclosure. In the accompanying drawings.

Figure 1:
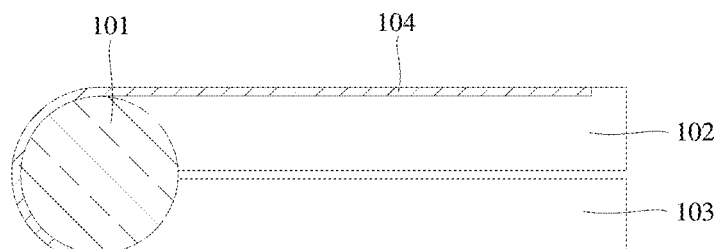
FIG. 1 is a schematic structural diagram of a mobile terminal in a folded state provided by related technology.

BRIEF DESCRIPTION OF MARKS IN THE DRAWING 101-a shaft; 102-a first shell, 103-a second shell, 104-a flexible screen;

100-a shaft, 200-a linkage mechanism, 210-a first linkage, 220-a second linkage, 230-a third linkage, 240-a fourth linkage, 250-a fifth linkage, 300-a connecting part, 310-a connecting hole, 400-clearance, A-a hinge shaft, B-a hinge shaft.

DESCRIPTION OF EMBODIMENTS

In order to make the objective, technical solution and advantages of the present disclosure clearer, the technical solution of the present disclosure will be described clearly and completely with reference to the specific embodiments of the present disclosure and the corresponding drawings. Apparently, the described embodiments are some but not all of the embodiments of the present disclosure. All other embodiments obtained by a person of ordinary skill in the art based on the embodiments of the present disclosure without creative efforts shall fall within the protection scope of the present disclosure.

The embodiments of the present disclosure are described below in detail with reference to the accompanying drawings.

Mobile terminal manufacturers usually obtain large screen by increasing the screen-to-body ratio of mobile terminal. As a result, mobile terminals gradually develop towards the direction of ultra-narrow frame or even full screen mobile terminals. However, as the amount of functions continues to increase, more and more electronic devices are integrated into mobile terminals. The pursuit of reducing the frame width by adjusting the position of electronic devices or reduce their volume has reached the ultimate, which makes it more and more difficult to increase the screen-to-body ratio of mobile terminal.

In this case, more and more mobile terminals obtain large screen by using foldable screen. In order to improve the display effect, a one-piece flexible screen is used as the foldable screen of mobile terminals in related technology. The folding of flexible screen is realized through the bending of the flexible screen.

Figure 2:
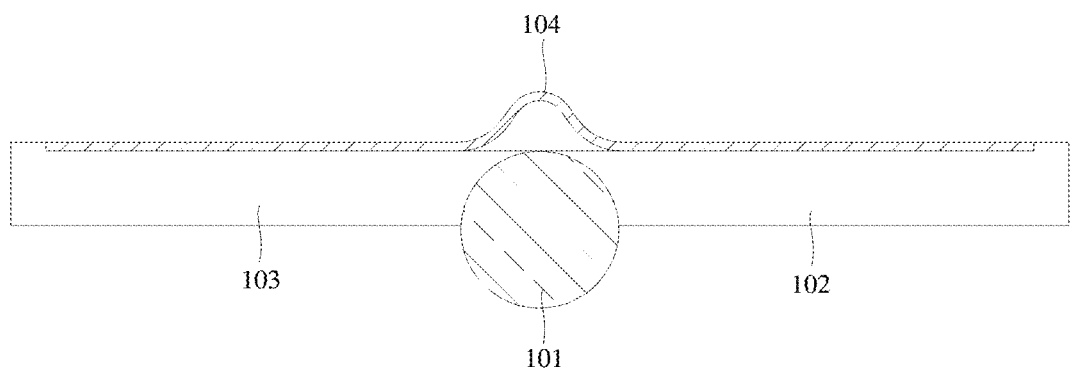
FIG. 2 is a schematic structural diagram of a mobile terminal shown in FIG. 1 in the unfolded state.

FIG. 1 and FIG. 2 are schematic structural diagrams of a common mobile terminal with flexible screen in folded and unfolded states. In the mobile terminals as shown in FIG. 1 and FIG. 2, the first shell 102 and the second shell 103 are rotated by a shaft 101 connected with the shells. A flexible screen 104 is partially arranged on the first shell 102, and its other part is arranged on the second shell 103 after crossing the shaft 101.

Due to the existence of the shaft 101, the distance between the first shell 102 and the second shell 103 in the unfolded state is smaller than the distance between the two in the folded state. As a result, when the mobile terminal is unfolded, the area of the flexible screen 104 and the shaft 101 is raised, resulting in the uneven surface of the flexible screen 104 and affecting the display effect.

As shown in FIG. 3 to FIG. 6, this embodiment of the present disclosure discloses a hinge mechanism, which can replace a shaft 101 described in the background, and realize the rotatable connection between the first shell 102 and the second shell 103, and folding of the mobile terminal, and the flexible screen 104.

The hinge mechanism disclosed in this embodiment of the present disclosure composes at least two shafts 100 arranged in a row, a linkage mechanism 200 and two connecting parts 300.

At least two shafts 100 are arranged in a row to form a shaft row. For example, the axes of the two adjacent shafts 100 are parallel. The linkage mechanism 200 is configured to connect the two adjacent shafts 100. The connecting parts 300 are configured to connect the hinge mechanism with other parts. The hinge mechanism is applied in the mobile terminal, and two connecting parts 300 can be connected with each of the first shell 102 and the second shell 103.

In the embodiment of the present disclosure, at least two shafts 100 are arranged in a row, and two adjacent shafts 100 are connected by the linkage mechanism 200. The linkage mechanism 200 may comprise a first linkage 210, a second linkage 220 and two shafts 100 connected with each other. One of the shafts is hinged to the first end of the first linkage 210, and the other is hinged to the first end of the second linkage 220. In this case, the first linkage 210 and the second linkage 220 can rotate relative to two adjacent shafts 100.

The second end of the first linkage 210 is hinged to the second end of the second linkage 220. As the first linkage 210 and the second linkage 220 can be hinged to the two adjacent shafts 100 respectively, and the first linkage 210 and the second linkage 220 are hinged to each other, the integral component formed by two adjacent shafts 100 and the linkage mechanism 200 connecting the two shafts can be bent and deformed through the rotation of related parts.

Figure 3:
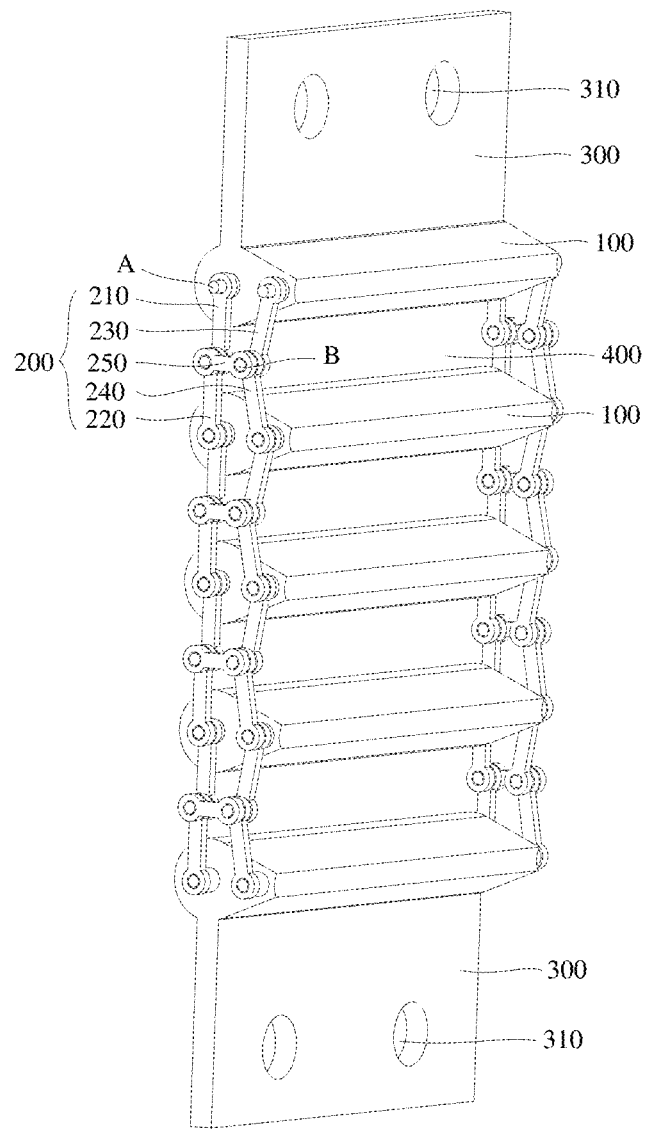
FIG. 3 is a stereoscopic view of a hinge mechanism in unfolded state as disclosed in this embodiment of the present disclosure.
Figure 5:
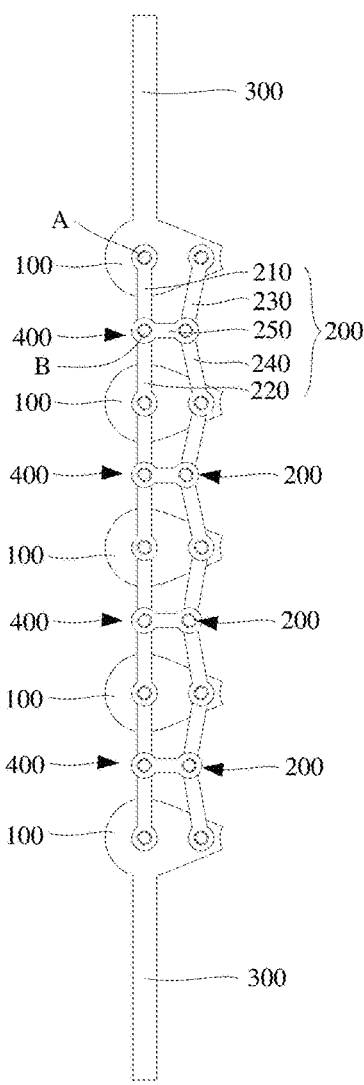
FIG. 5 is a schematic plane structural diagram of a hinge mechanism in unfolded state as disclosed in this embodiment of the present disclosure.

When the hinge point where the first linkage 210 and the second linkage 220 are respectively hinged to two adjacent shafts 100 and the hinge point of the first linkage 210 and the second linkage 220 are in the same straight line, there is a gap 400 between the two adjacent shafts 100. In this case, the first end of the first linkage 210 and the first end of the second linkage 220 may be considered to extend in the opposite direction, as shown in FIG. 3 and FIG. 5. In this state, the hinge mechanism is extended to its longest length.

Figure 4:
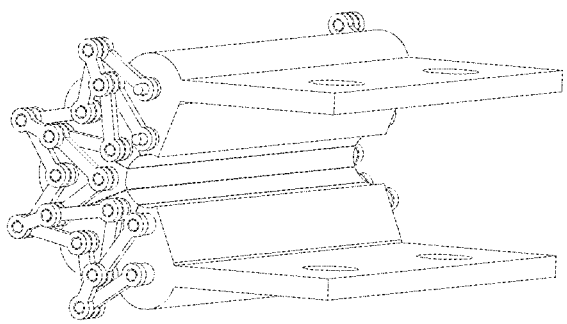
FIG. 4 is a stereoscopic view of a hinge mechanism in folded state as disclosed in this embodiment of the present disclosure.
Figure 6:
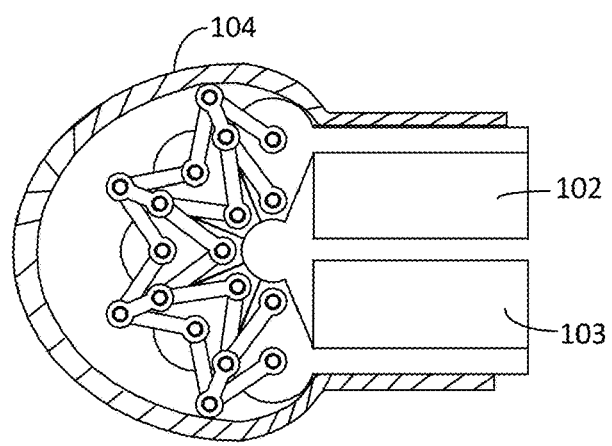
FIG. 6 is a schematic plane structural diagram of a hinge mechanism in folded state as disclosed in this embodiment of the present disclosure.

Because the first linkage 210 and the second linkage 220 are hinged, different intersection angles between the first linkage 210 and the second linkage 220 may generate different distances between two adjacent shafts 100. It can be seen that in this embodiment, the distance between two adjacent shafts 100 can be adjusted by the linkage mechanism 200, so that the length of the entire hinge mechanism can be adjusted. When the first end of the first linkage 210 and the first end of the second linkage 220 extend in the opposite direction, the hinge mechanism is longest, as shown in FIG. 3 and FIG. 5. When the first linkage 210 and the second linkage 220 rotate relative to each other till the two adjacent shafts 100 come into contact with each other, the hinge mechanism is shortest, as shown in FIG. 4 and FIG. 6.

It can be seen from the above description that, operators can bend the entire hinge mechanism disclosed in the present disclosure to deform the linkage mechanism 200, and finally shorten the hinge mechanism by reducing the width of the gap 400 between two adjacent shafts 100. When the hinge mechanism is pulled, the deformed linkage mechanism 200 can lengthen the hinge mechanism by increasing the width of the gap 400 between two adjacent shafts 100. As can be seen, the hinge mechanism disclosed in this embodiment of the present disclosure can change its length when it is bent or straight. Mobile terminal with such a hinge mechanism can undoubtedly avoid the problem of raised flexible screen 104 when it is unfolded.

In order to improve the deformation stability of the linkage mechanism 200, in the hinge mechanism disclosed in this embodiment of the present disclosure, the linkage mechanism 200 can also comprise a third linkage 230 and a fourth linkage 240. In the two adjacent shafts 100, one is hinged to the first end of the third linkage 230, and the other is hinged to the first end of the fourth linkage 240. The second end of the third linkage 230 is hinged to the second end of the fourth linkage 240.

In this case, the linkage mechanism 200 comprises more linkages. The third linkage 230 and the fourth linkage 240 can work together with the first linkage 210 and the second linkage 220 to adjust the length of hinge mechanism, without affecting the operation of the first linkage 210 and the second linkage 220. Of course, it can also be considered as a redundant design. With the structure, when the first link 210 and the second link 220 fail, the third linkage 230 and the fourth linkage 240 can still realize the normal operation of the hinge mechanism. Of course, this design can also avoid the problem of too flexible deformation between the two adjacent shafts 100 that are merely connected by the first linkage 210 and the second linkage 220.

The first linkage component is formed by the first linkage 210 and the second linkage 220, and the second linkage component is formed by the third linkage 230 and the fourth linkage 240. To realize more coordinated deformation of the first linkage component and the second linkage component during work, in an optional scheme, the hinge mechanism disclosed in this embodiment of the present disclosure may also comprise a fifth linkage 250. The fifth linkage 250 is connected between the first linkage component and the second linkage component, the first end of the fifth linkage 250 may be hinged to the hinged point of the third linkage 230 and the fourth linkage 240, and the second end of the fifth linkage 250 can be hinged to the hinged point of the first linkage 210 and the second linkage 220. The fifth linkage 250 plays a connecting role and can easily realize a more consistent deformation trend of the first linkage component and the second linkage component.

In an optional scheme, the third linkage 230 and the fourth linkage 240 may be symmetrically arranged along the axis of the fifth linkage 250. Similarly, the first linkage 210 and the second linkage 220 may also be symmetrically arranged with the fifth linkage 250 as the center. The symmetrical distribution manner is undoubtedly more conducive to the more stable deformation of the linkage mechanism 200.

In the embodiment of the present disclosure, the shaft 100 can be an ordinary cylindrical shaft or other shaped shaft and its specific shape is not limited in the embodiment. As shown in FIG. 3 to FIG. 6, in a specific embodiment, the shafts 100 are camshafts that include convex portion, and the convex portion of each camshaft is located on the same side of the shaft row formed by at least two shafts 100. The shafts 100 are camshafts that can make the combination between adjacent shafts 100 more compact when the hinge mechanism is folded, and are conducive to improving the stability of the hinge mechanism in the folded state. In the optional scheme, when the hinge mechanism is in a bending state (as shown in FIG. 6), the convex portions of two adjacent shafts 100 abut on each other. Undoubtedly hinge mechanism in bending state can therefore achieve the best bending effect, and make the entire hinge mechanism more compact and stable in bending state.

In the optional scheme, the first end of the third linkage 230 and the first end of the fourth linkage 240 are hinged to the end surface of each of the convex portion of the two adjacent shafts 100, the first end of the first linkage 210 and the first end of the second linkage 220 are hinged to the center of each of the end surfaces of the two adjacent shafts 100. In this case, there is enough distance between the first linkage 210 and the third linkage 230 as well as between the second linkage 220 and the fourth linkage 240, which is more conducive to the deformation of the entire linkage mechanism 200. The length of the fifth linkages 250 is less than the distance between two hinged points in the shaft 100. In this case, it is easier to realize a more consistent deformation trend of the first linkage component and the second linkage component.

As described above, a connecting part 300 is fixedly connected with a shaft 100. In order to reduce assembly workload and improve the strength of the components, in the optional scheme, a connecting part 300 and the shaft 100 connected with it can be an integrated structure.

The connecting part 300 can be provided with a connecting piece or a connecting structure. For example, the connecting part 300 may be provided with a connecting hole 310. A variety of connecting part 300 structures can be used. In a specific embodiment, the connecting part 300 may be a connecting plate.

Hinge joint can be realized in many forms. For example, a hinge shaft A can be fixed to the end surface of the shaft 100, and the shaft 100 can be matched with the hinge holes in the first linkage 210, the second linkage 220, the third linkage 230 or the fourth linkage 240 through the hinge shaft A, realizing a rotation fit. Similarly, rotation fit is realized respectively between the first linkage 210 and the second linkage 220, between the fifth linkage 250 and each of the first linkage 210 and the second linkage 220, between the third linkage 230 and the fourth linkage 240, and between the fifth linkage 250 and each of the third linkage 230 and the fourth linkage 240 through the through hole sheathed on the hinge shaft B.

Based on the hinge mechanism disclosed in this embodiment of the present disclosure, this embodiment of the present disclosure discloses a mobile terminal comprising a flexible screen 104, a first shell 102, a second shell 103 and a hinge mechanism described above. The first shell 102 is fixedly connected to a connecting part 300, and the second shell 103 is fixedly connected with the other connecting part 300. The flexible screen 104 is installed in the mounting area formed by the first shell 102, the second shell 103 and the hinge mechanism.

A mobile terminal disclosed in this embodiment of the present disclosure may be a mobile phone, a tablet computer, an e-book reader, a wearable device or other mobile terminal with flexible screen. In the embodiment of the present disclosure, the specific type of mobile terminals is not limited.

The above embodiments of the present disclosure mainly describe the differences between various embodiments. As long as the different optimization features of the various embodiments are not contradictory, the various embodiments can be combined to form a better embodiment. Considering the brevity of the text, details are not described herein again.

The foregoing descriptions are merely specific embodiments of the present disclosure, but are not intended to limit the present disclosure. For those skilled in the art, the present disclosure may have various modifications and variations. Any modification, equivalent replacement and improvement made within the spirit and principle of the present disclosure shall fall within the protection scope of claims in the present disclosure.

What is claimed is:

1. A hinge mechanism comprising at least two shafts arranged in a row, a linkage mechanism and two connecting parts, wherein the two connecting parts are fixedly connected to two shafts on outermost sides, respectively; two adjacent shafts are connected by the linkage mechanism; the linkage mechanism comprises a first linkage and a second linkage; one of the two adjacent shafts is hinged to a first end of the first linkage, another shaft of the two adjacent shafts is hinged to a first end of the second linkage, and a second end of the first linkage is hinged to a second end of the second linkage; and when hinge points where the first linkage and the second linkage are respectively hinged to the two adjacent shafts and a hinge point between the first linkage and the second linkage are in a same straight line, there is a gap between the two adjacent shafts;

wherein the shafts are camshafts, and convex portions of the camshafts are located on a same side of the row in which the at least two shafts are arranged.

2. The hinge mechanism according to claim 1, wherein the linkage mechanism further comprises a third linkage and a fourth linkage, one of the two adjacent shafts is hinged to a first end of the third linkage, another shaft of the two adjacent shafts is hinged to a first end of the fourth linkage, and a second end of the third linkage is hinged to a second end of the fourth linkage.

3. The hinge mechanism according to claim 2, wherein the linkage mechanism further comprises a fifth linkage; the first linkage and the second linkage constitute a first linkage component, and the third linkage and the fourth linkage constitute a second linkage component; the fifth linkage is connected between the first linkage component and the second linkage component, a first end of the fifth linkage is hinged to a hinged point between the third linkage and the fourth linkage, and a second end of the fifth linkage is hinged to the hinge point between the first linkage and the second linkage.

4. The hinge mechanism according to claim 3, wherein the third linkage and the fourth linkage, as well as the first linkage and the second linkage are symmetrically arranged along an axis of the fifth linkage.

5. The hinge mechanism according to claim 4, wherein the first end of the third linkage and the first end of the fourth linkage are hinged to end surfaces of convex portions of the two adjacent shafts, respectively; and the first end of the first linkage and the first end of the second linkage are hinged to centers of end surfaces of the two adjacent shafts, respectively.

6. The hinge mechanism according to claim 5, wherein when the hinge mechanism is in a bending state, the convex portions of the two adjacent shafts abut on each other.

7. The hinge mechanism according to claim 1, wherein each of the connecting parts is provided with at least two connecting holes.

8. The hinge mechanism according to claim 1, wherein the connecting parts are connecting plates.

9. A mobile terminal, comprising a flexible screen, a first shell, a second shell and the hinge mechanism according to claim 1, wherein the first shell is fixedly connected to a connecting part, the second shell is fixedly connected to another connecting part, and the flexible screen is disposed in a mounting area formed by the first shell, the second shell and the hinge mechanism.

10. The mobile terminal according to claim 9, wherein the mobile terminal is a mobile phone, a tablet computer, an e-book reader or a wearable device.

11. The mobile terminal according to claim 9, wherein the linkage mechanism further comprises a third linkage and a fourth linkage, one of the two adjacent shafts is hinged to a first end of the third linkage, another shaft of the two adjacent shafts is hinged to a first end of the fourth linkage, and a second end of the third linkage is hinged to a second end of the fourth linkage.

12. The mobile terminal according to claim 11, wherein the linkage mechanism further comprises a fifth linkage; the first linkage and the second linkage constitute a first linkage component, and the third linkage and the fourth linkage constitute a second linkage component; the fifth linkage is connected between the first linkage component and the second linkage component, a first end of the fifth linkage is hinged to a hinged point between the third linkage and the fourth linkage, and a second end of the fifth linkage is hinged to the hinge point between the first linkage and the second linkage.

13. The mobile terminal according to claim 12, wherein the third linkage and the fourth linkage, as well as the first linkage and the second linkage are symmetrically arranged along an axis of the fifth linkage.

14. The mobile terminal according to claim 13, wherein the first end of the third linkage and the first end of the fourth linkage are hinged to end surfaces of convex portions of the two adjacent shafts, respectively; and the first end of the first linkage and the first end of the second linkage are hinged to centers of end surfaces of the two adjacent shafts, respectively.

15. The mobile terminal according to claim 14, wherein when the hinge mechanism is in a bending state, the convex portions of the two adjacent shafts abut on each other.

16. The mobile terminal according to claim 9, wherein each of the connecting parts is provided with at least two connecting holes.

17. The mobile terminal according to claim 9, wherein the connecting parts are connecting plates.

* * * * *